US006998938B2

(12) United States Patent
Lin et al.

(10) Patent No.: US 6,998,938 B2
(45) Date of Patent: Feb. 14, 2006

(54) LUMPED-ELEMENT LOW-PASS FILTER IN MULTI-LAYERED SUBSTRATE

(75) Inventors: Yo-Shen Lin, Taipei (TW); Ko-Mai Li, Taipei (TW)

(73) Assignee: Chi Mei Communication Systems, Inc., Tainan (TW)

( * ) Notice: Subject to any disclaimer, the term of this patent is extended or adjusted under 35 U.S.C. 154(b) by 0 days.

(21) Appl. No.: 10/708,541

(22) Filed: Mar. 10, 2004

(65) Prior Publication Data
US 2005/0200431 A1    Sep. 15, 2005

(51) Int. Cl.
*H03H 7/09* (2006.01)
(52) U.S. Cl. ........................... 333/177; 333/185
(58) Field of Classification Search ........ 333/177–180, 333/181, 184, 185
See application file for complete search history.

(56) References Cited

U.S. PATENT DOCUMENTS

| | | | | |
|---|---|---|---|---|
| 5,602,517 A | * | 2/1997 | Kaneko et al. ............. 333/185 |
| 5,612,656 A | * | 3/1997 | Sakamoto et al. .......... 333/175 |
| 5,977,845 A | * | 11/1999 | Kitahara ..................... 333/184 |
| 6,114,925 A | * | 9/2000 | Lo .............................. 333/185 |
| 6,483,400 B1 | * | 11/2002 | Phillips, Jr. ................. 333/185 |
| 6,714,101 B1 | * | 3/2004 | Kim et al. .................... 333/177 |

* cited by examiner

Primary Examiner—Seungsook Ham
(74) Attorney, Agent, or Firm—Winston Hsu

(57) ABSTRACT

A lumped-element low-pass filter is formed in a multi-layered substrate. A negative mutual inductance between two inductors is adjusted to a designed value and utilized to improve the rejection in the stopband of the low-pass filter. The two inductors are spiral in shape and the orientations of the first inductor and the second inductor are of opposite sense such that a mutual inductance between the first inductor and the second inductor is negative and equals a designed value. A first capacitor and a second capacitor are shunt-connected to the first and the second inductor respectively to form the elliptic-type filter. A third capacitor is electrically connected to ground at its first end, and electrically connected to the end of the second inductor at which the second inductor in electrically connected to the first inductor in series at its second end.

14 Claims, 10 Drawing Sheets

LUMPED-ELEMENT LOW-PASS FILTER IN MULTI-LAYERED SUBSTRATE

BACKGROUND OF INVENTION

1. Field of the Invention

The present invention relates to a lumped-element low-pass filter, and more particularly, to a lumped-element low-pass filter realized in a multi-layered substrate.

2. Description of the Prior Art

Low-pass filters are widely used as building blocks in circuit designs. They are usually used to filter out unwanted spurious responses and harmonics of higher frequencies. Performance of a low-pass filter is characterized by insertion loss in the passband and rejection in the stopband. The level of rejection in the stopband is mainly determined by the order of the filter. The higher the order of the filter, the better the rejection in the stopband. However, g filter of higher order requires more elements in filter designs, which leads to a larger circuit size and more insertion loss. Shown in FIG. 1 is a prototype circuit of a conventional third order low-pass filter. P11 and P12 are two ports of the filter. L11 and L12 are two inductors, and C13 is a capacitor. In RF circuit designs for modern wireless handheld devices, due to the tight requirement on circuit size, the third-order filter as shown in FIG. 1 is usually employed for a balance between circuit size and filter performance.

In case that the rejection in the stopband of the third-order filter shown in FIG. 1 is not enough to meet the system requirement, an elliptic-type low-pass filter can be employed. Please refer to FIG. 2. FIG. 2 is a prototype circuit of a conventional third-order elliptic-type low-pass filter. Compared with the low-pass filter in FIG. 1, here two additional capacitors C21 and C22 are added in shunt with inductors L21 and L22, respectively. The resulting parallel LC circuits will create a notch in the insertion loss response within the stopband, and a better stopband rejection can be achieved compared to the filter in FIG. 1. Please refer to FIG. 3. FIG. 3 is a diagram of frequency response of a conventional third-order low-pass filter and a conventional third-order elliptic-type low-pass filter. The transverse axis represents frequency, and the vertical axis represents amplitude in dB. A curve S211 is the transmission coefficient of the conventional third-order low-pass filter shown in FIG. 1, and a curve S212 is the transmission coefficient of the conventional third-order elliptic-type low-pass filter shown in FIG. 2. As shown in FIG. 3, there i s a notch at a frequency f 2 in the stopband of the elliptic-type filter, such that a better stopband rejection is achieved. In addition, it can be seen that the curve S212 is sharper than the curve S211 in the transition band, which is usually considered a good characteristic for a low-pass filter.

Low-pass filters of good rejection in the stopband and sharper frequency response in the transition band are desirable, while the larger number of circuit elements and hence the circuit area of higher order filters is unacceptable in modern RF circuit designs. Therefore, the task of designing a low-pass filter with fewer elements and a good rejection in the stopband has become one of the thresholds in advanced development of RF circuits.

SUMMARY OF INVENTION

It is therefore a primary objective of the claimed invention to provide a low-pass filter realized with lumped elements in a multi-layered substrate that can provide better rejection in the stopband compared to that of the conventional low-pass filter.

In the claimed invention, a negative mutual inductance between two inductors of a conventional third-order elliptic-type low-pass filter is enlarged to a designed value and utilized to create an additional notch in the stopband, so as to improve the rejection in the stopband of the claimed invention low-pass filter. The two inductors are spiral in shape and the orientations of the first inductor and the second inductor are of opposite sense such that a mutual inductance between the first inductor and the second inductor is negative and equals a designed value. A first capacitor and a second capacitor are shunt-connected to the first and the second inductor respectively to form the elliptic-type filter. A third capacitor is electrically connected to ground at its first end, and electrically connected to the end of the second inductor at which the second inductor is electrically connected to the first inductor in series at its second end.

It is an advantage of the claimed invention that utilization of the mutual inductance improves rejection in the stop-band of the conventional elliptic-type low-pass filter without adding additional circuit elements. In the claimed invention, a sharper transmission coefficient curve at the passband edge with lower order filter design is obtained. As low-pass filters are widely used as building blocks in RF circuit design, a significant savings in circuit area, and hence cost in manufacturing, is obtained.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
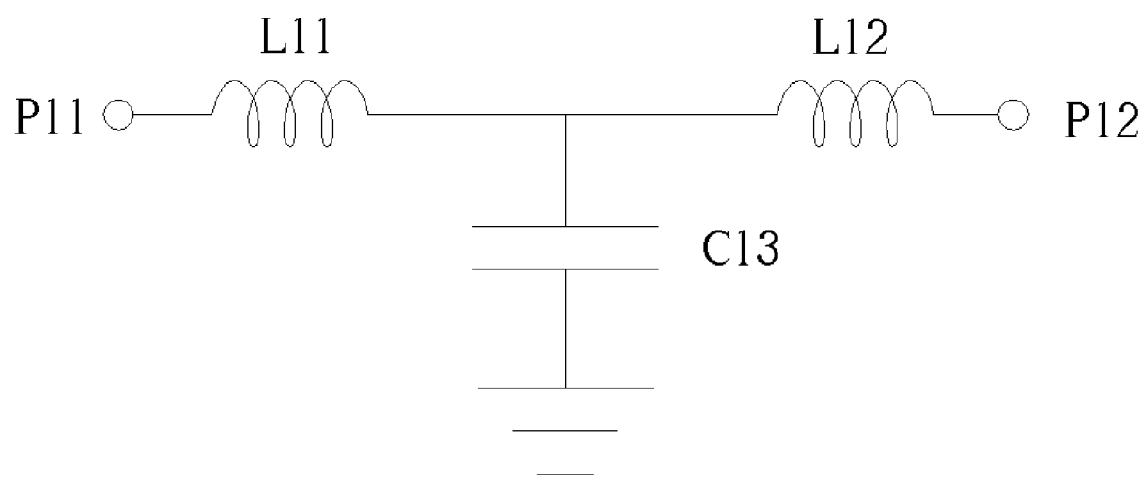
FIG. 1 is a diagram of a prior art third-order low-pass filter.
Figure 2:
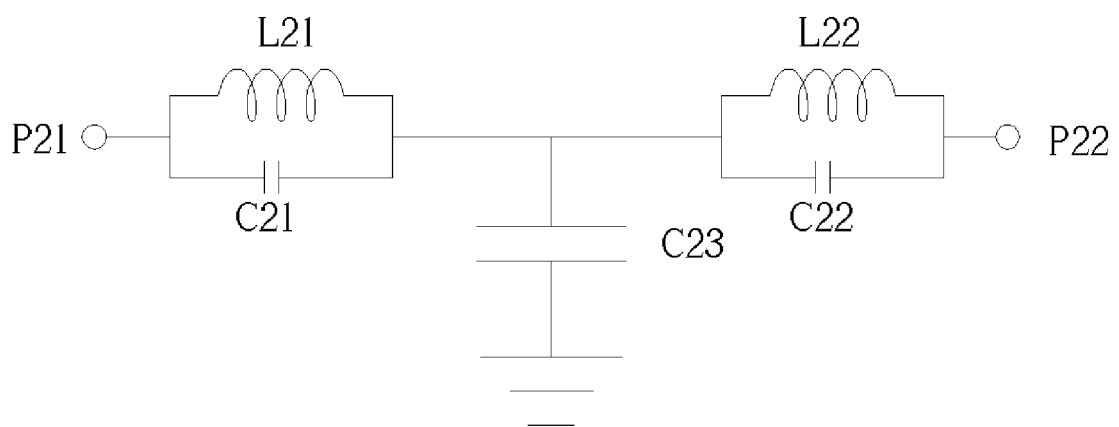
FIG. 2 is a diagram of a prior art third-order elliptic-type low-pass filter.
Figure 3:
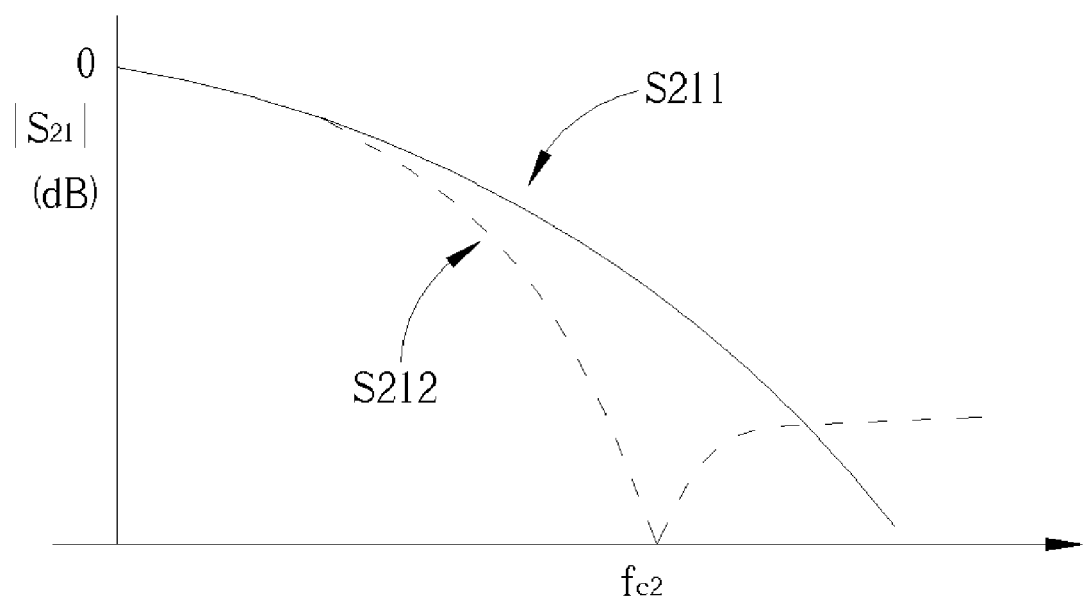
FIG. 3 is a diagram of frequency response of the prior art third-order low-pass filter and the prior art third-order elliptic-type low-pass filter.
Figure 4:
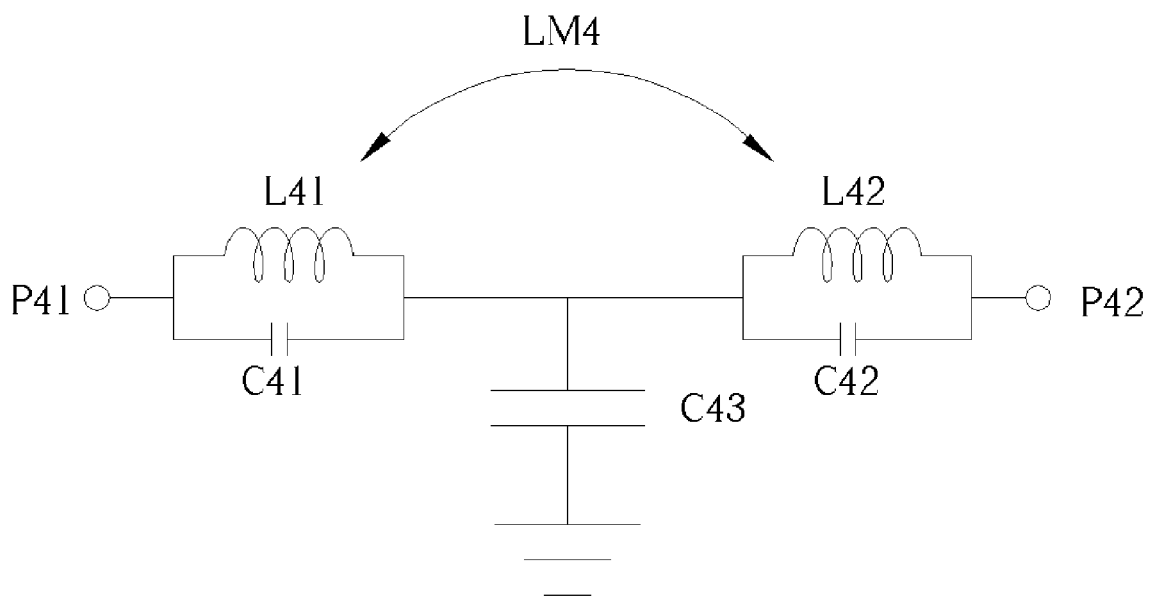
FIG. 4 is a diagram of a lumped-element elliptic-type low-pass filter showing mutual inductance between inductors.
Figure 5:
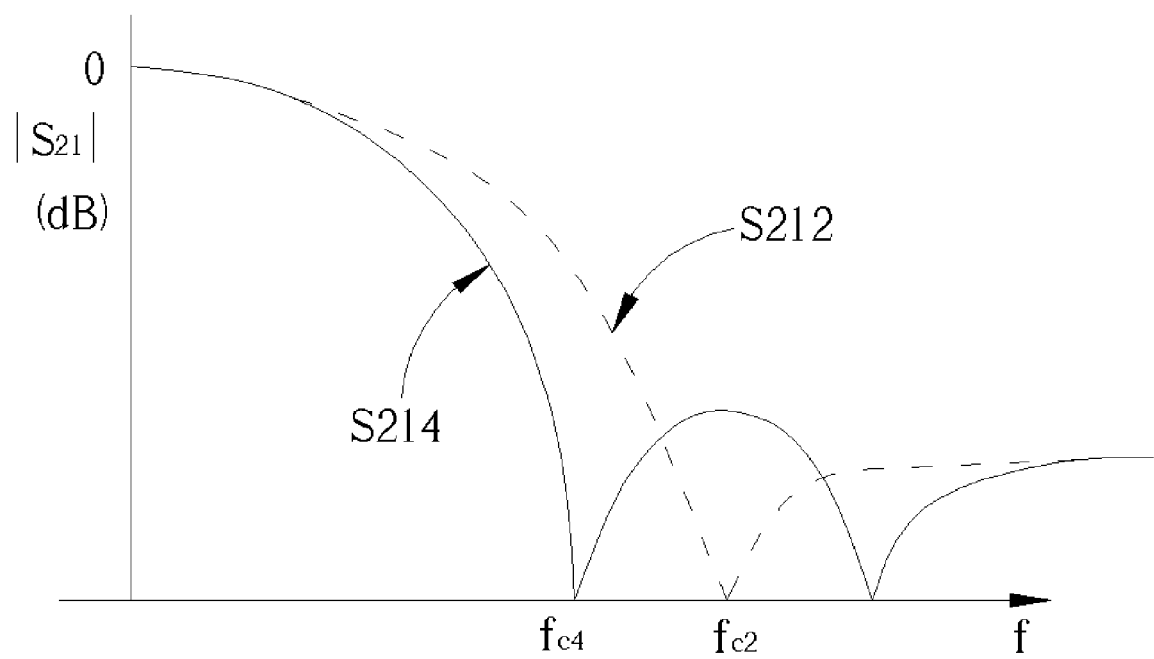
FIG. 5 is a diagram of frequency response of a present invention third-order elliptic-type low-pass filter.

Briefly described, the present invention discloses an improved lumped-element third-order elliptic-type low-pass filter. Please refer to FIG. 4. FIG. 4 is a diagram of a lumped-element elliptic-type low-pass filter showing a mutual inductance LM4 between two inductors L41, L42. The filter further includes two ports P41 and P42, capacitors C41 and C42 connected in parallel with inductors L41 and L42 respectively, and a capacitor C43 shunted to ground. As we know, even in the prior art there is a mutual inductance between two inductors as it is a natural physical phenomenon. The mutual inductance affects frequency response of the circuit and it is therefore avoided as much as possible in the prior art. However, the present invention introduces a small negative mutual inductance for improving the frequency response of the lumped-element elliptic-type low-pass filter. FIG. 5 is a diagram of frequency response of a present invention third-order elliptic-type low-pass filter compared with that of a conventional third-order elliptic-type low-pass filter as shown in FIG. 2. The transverse axis represents operating frequency, and the vertical axis represents amplitude of frequency response in dB. Curve S212 is the transmission coefficient of the conventional third-order elliptic-type low-pass filter shown in FIG. 2, and curve S214 is the transmission coefficient of the present invention third-order elliptic-type low-pass filter shown in FIG. 4 with a negative mutual inductance of a predetermined value. As illustrated in FIG. 5, the present invention low-pass filter in which the mutual inductance is retained and designed as a negative value exhibits two notches at the stopband, and hence the rejection in the stopband is further improved. The location of the notches can be adjusted to the desired locations by varying the value of mutual inductance.

Figure 6:
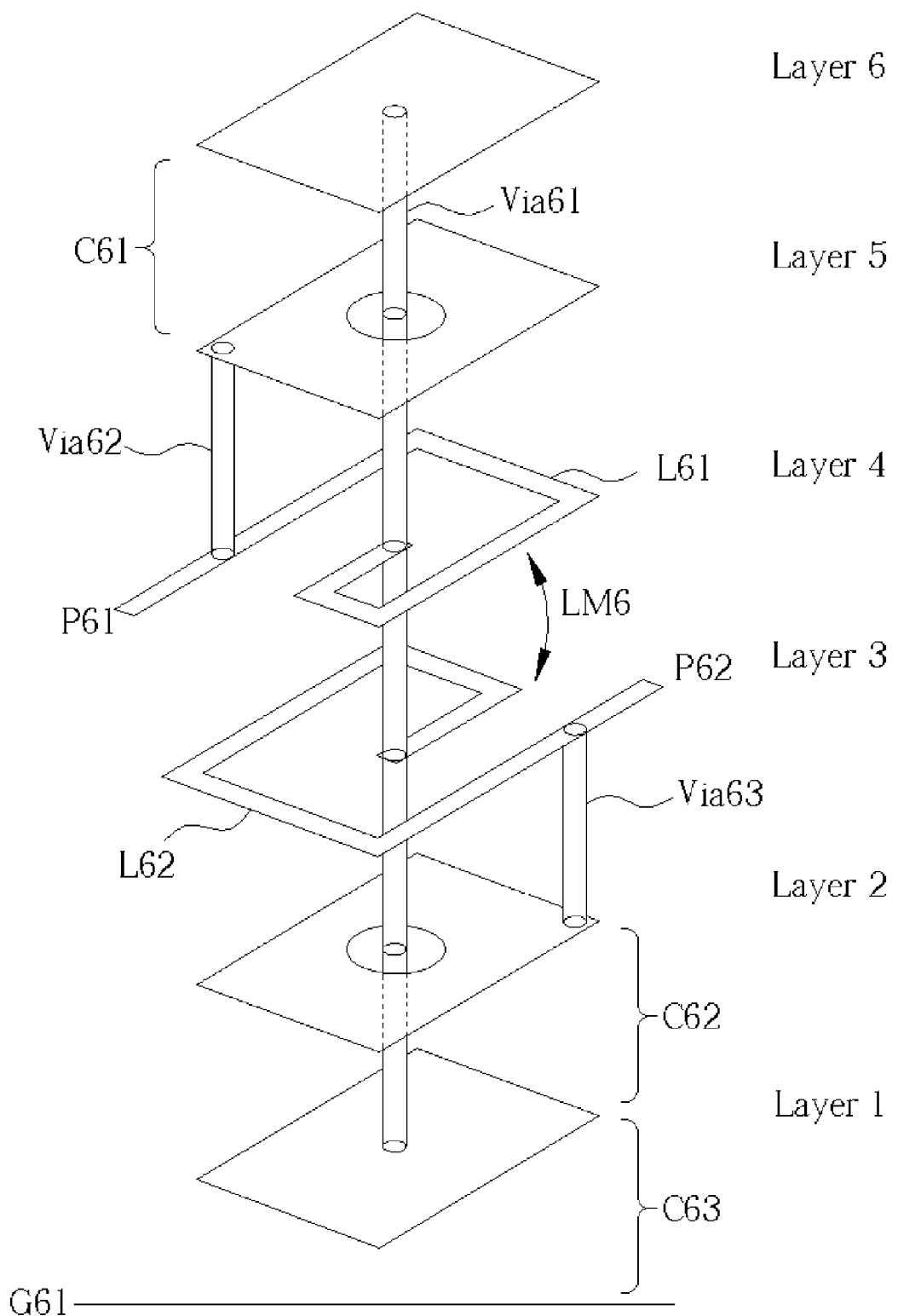
FIG. 6 is a diagram of a first embodiment of the present invention lumped-element low-pass filter realized in a multi-layered substrate.
Figure 7:
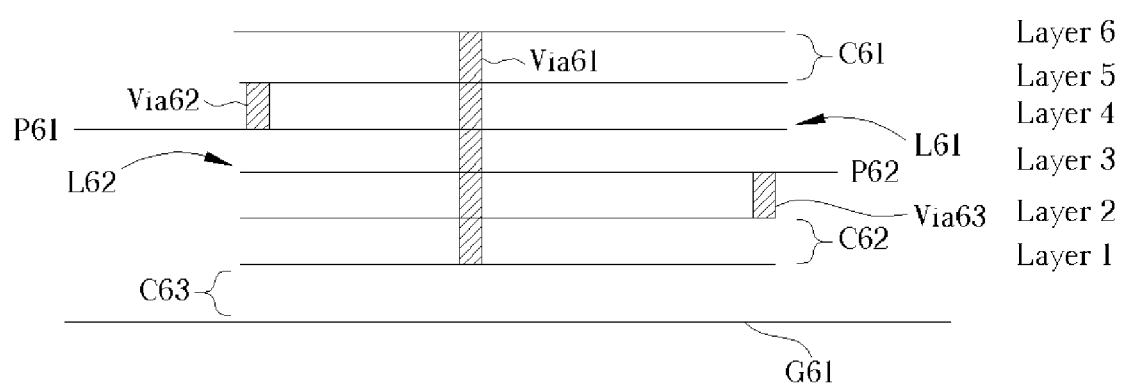
FIG. 7 is a side view diagram of FIG. 6.

It is known that the mutual inductance relates to the distance and geometrical relations between the two inductors. Therefore, it is very applicable to implement the present invention in a 3-dimensional structure such as a multi-layered substrate. Based on the aforementioned circuit model shown in FIG. 4, a novel lumped-element low-pass filter with good stopband rejection may be realized in a very small area. Please refer to FIG. 6. FIG. 6 shows the first embodiment of the present invention realized in a multi-layered substrate with a bottom ground plane G61. The filter includes inductors L61 and L62, capacitors C61, C62, and C63, and vias Via61, Via62, and Via63 penetrating the substrate and connecting different layers. Inductors L61 and L62 are realized with rectangular conductive spirals on layer 4 and layer 3 respectively. Note that the orientations of inductors L61 and L62 are different, such that a negative mutual inductance LM6 is established between inductors L61 and L62 with this arrangement. The negative mutual inductance LM6 may be adjusted to a designed value by appropriately adjusting the shapes of the inductors L61 and L62, or by selection of the distance between layer 3 and layer 4. The inductor L62 is electrically connected to the inductor L61 in series through the via Via61. The capacitor C61 comprises two plates formed on layer 5 and layer 6. The plate formed on layer 5 is connected to one end of the inductor L61 through the via Via62, and the plate formed on layer 6 is connected to another end of the inductor L61 through the via Via61. That is, the capacitor C61 is shunt-connected to the inductor L61 through the vias. The capacitor C62 comprises two plates formed on layer 1 and layer 2. The plate formed on layer 2 is connected to one end of the inductor L62 through the via Via63 and the plate formed on layer 1 is connected to another end of the inductor L62 through the via Via61. In this manner, the capacitor C62 is shunt-connected to the inductor L62 through the vias. The capacitor C63 shunted to ground is formed between the plate on layer 1 and the bottom ground plane G61. The resulting circuit of FIG. 6 is equivalent to the circuit shown in FIG. 4 in which the inductances L61, L62, LM6, and the capacitances C61, C62, and C63 correspond to the inductances L41, L42, LM4, and the capacitances C41, C42, and C43 respectively, and may achieve the frequency response as shown in FIG. 5. The value of the mutual inductance LM6 is determined according to an algorithm such that the frequency response of the low-pass filter meets the desired specifications on stopband rejection. In addition, the circuit size is very compact due to the vertical arrangement of circuit elements. FIG. 7 is a side view diagram of the circuit of FIG. 6.

Figure 8:
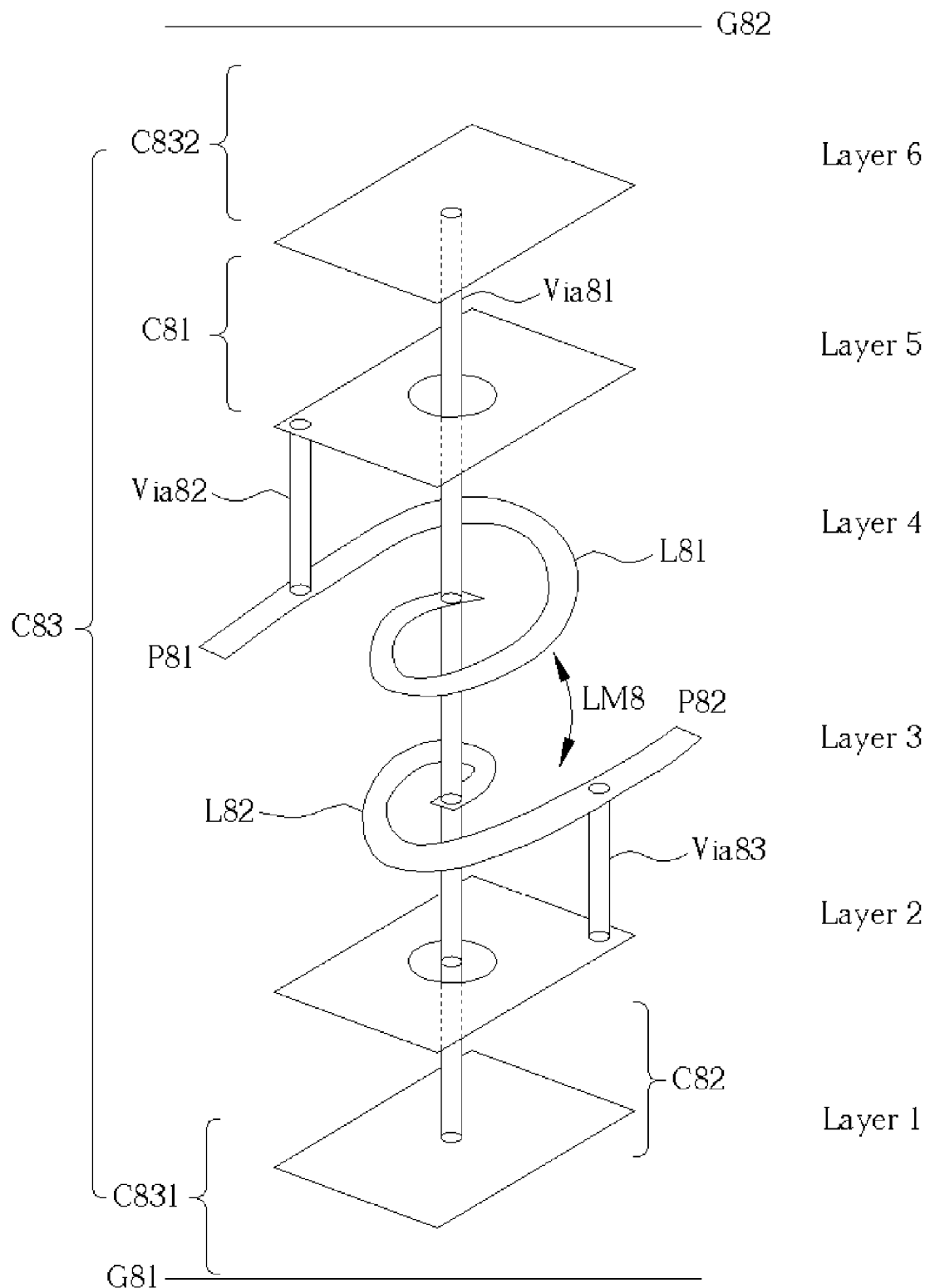
FIG. 8 is a diagram of a second embodiment of the present invention lumped-element low-pass filter realized in a multi-layered substrate.

FIG. 8 shows the second embodiment of the present invention realized in a multi-layered substrate with both a top ground plane G82 and a bottom ground plane G81. FIG. 8 illustrates inductors L81 and L82, capacitors C81, C82, and C83, and vias Via81, Via82, and Via83 penetrating the substrate and connecting different layers. The inductors L81 and L82 are realized by circular conductive spirals on layer 4 and layer 3 respectively. Note that the orientations of the inductors L81 and L82 are different. A negative mutual inductance LM8 is established between the inductors L81 and L82 with this arrangement, and it may achieve a designed value by appropriately adjusting the shapes of L81 and L82, or by selection of the distance between layer 3 and layer 4. The inductor L82 is electrically connected to the inductor L81 in series through the via Via81 penetrating the substrate. The capacitor C81 comprises two plates formed on layer 5 and layer 6. The plate formed on layer 5 is connected to one end of the inductor L81 through the via Via82 and the plate formed on layer 6 is connected to another end of the inductor L81 through the via Via81. That is, the capacitor C81 is shunt-connected to the inductor L81 through the vias. The capacitor C82 comprises two plates formed on layer 1 and layer 2. The plate formed on layer 2 is connected to one end of the inductor L82 through the via Via83 and the plate formed on layer 1 is connected to another end of the inductor L82 through the via Via81. In this manner, the capacitor C82 is shunt-connected to the inductor L82 through the vias. The capacitor C83 comprises two sub capacitors C831 and C832 shunt-connected to each other. The capacitor C831 is formed between layer 1 and the bottom ground plane G81, and the plate formed on layer 1 is connected to the via Via81. The capacitor C832 is formed between layer 6 and the top ground plane G82, and the plate formed on layer 6 is connected to the via Via81. Thus, each of the metal plates on layer 1 and layer 6 can be made smaller. The resulting circuit shown in FIG. 8 is equivalent to the circuit shown in FIG. 4 in which the inductances L81, L82, LM8, and the capacitances C81, C82, and C83 correspond to the inductances L41, L42, LM4, and the capacitances C41, C42, and C43 respectively, and may achieve the frequency response as shown in FIG. 5.

Figure 9:
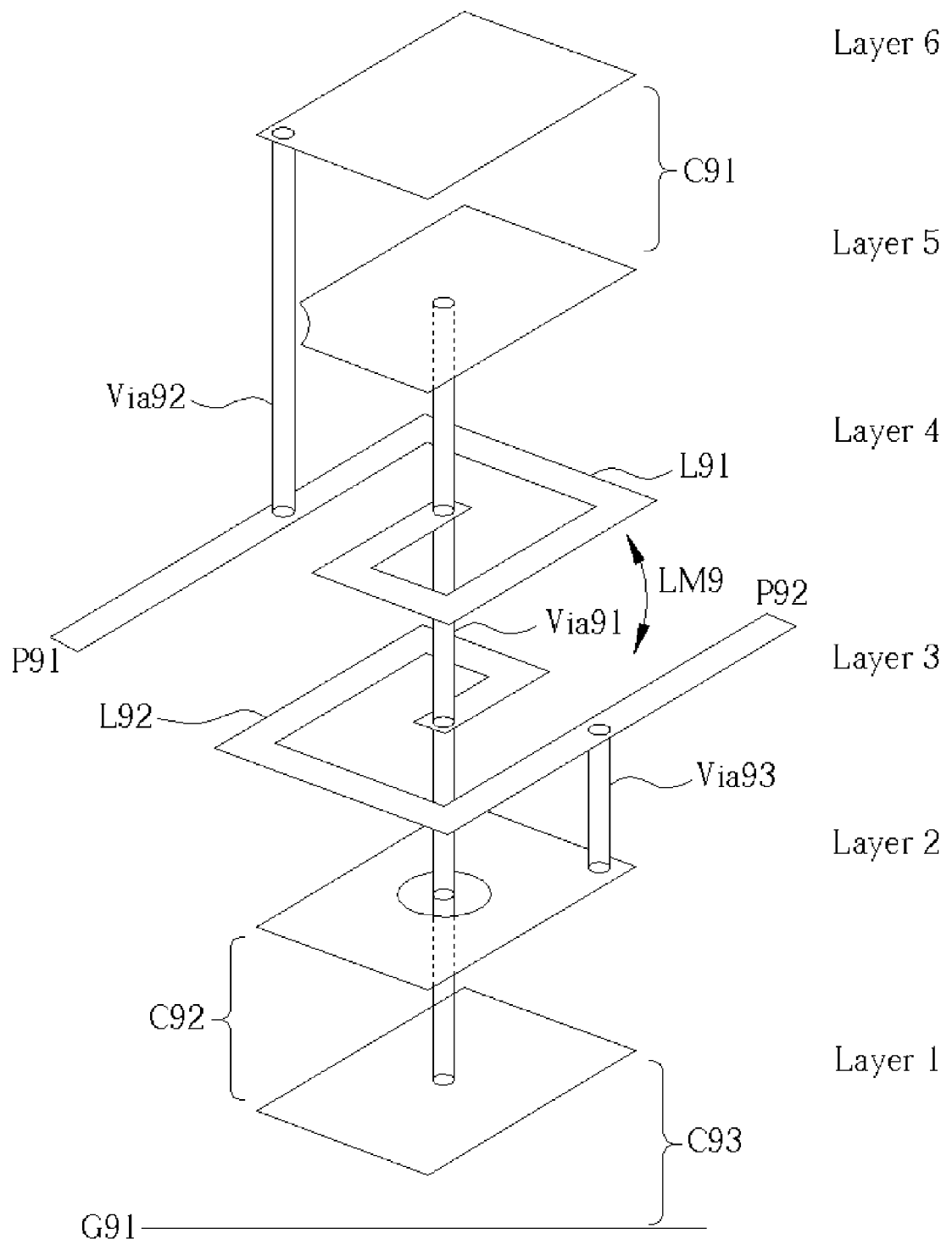
FIG. 9 is a diagram of a third embodiment of the present invention lumped-element low-pass filter realized in a multi-layered substrate.

Please refer to FIG. 9. FIG. 9 is the third embodiment of the present invention realized in a multi-layered substrate with a bottom ground plane G91. FIG. 9 illustrates inductors L91 and L92, capacitors C91, C92, and C93, and vias Via91, Via92, and Via93 penetrating the substrate and connecting different layers. Inductors L91 and L92 are realized by rectangular conductive spirals on layer 4 and layer 3 respectively. The orientations of inductors L91 and L92 are different so that a negative mutual inductance LM9 is established between inductors L91 and L92 with this arrangement. The inductor L92 is electrically connected to the inductor L91 in series through the via Via91. The capacitor C91 comprises two plates formed on layer 5 and layer 6. The plate formed on layer 6 is connected to one end of the inductor L91 through the via Via92 and the plate formed on layer 5 is connected to another end of the inductor L91 through the via Via91. That is, the capacitor C91 is shunt-connected to the inductor L91 through the vias. The capacitor C92 comprises two plates formed on layer 1 and layer 2. The plate formed on layer 2 is connected to one end of the inductor L92 through the via Via93 and the plate formed on layer 1 is connected to an-other end of the inductor L92 through the via Via9l. In this manner, the capacitor C92 is shunt-connected to the inductor L92 through the vias. The capacitor C93 shunted to ground is formed between the plate on layer 1 and the bottom ground plane G91. The resulting circuit of FIG. 9 is equivalent to the circuit shown in FIG. 4 in which the inductances L91, L92, LM9, and the capacitances C91, C92, and C93 correspond to the inductances L41, L42, LM4, the capacitances C41, C42, and C43 respectively, and may achieve the frequency response as shown in FIG. 5. Compared to the structure shown in FIG. 6, the realization in FIG. 9 can avoid parasitic coupling between the metal plate on layer 5 with other circuit elements on top of layer 6, such as when this coupling effect is added to the capacitor C93 through the via and causes unwanted frequency shift in the low-pass filter frequency response.

Figure 10:
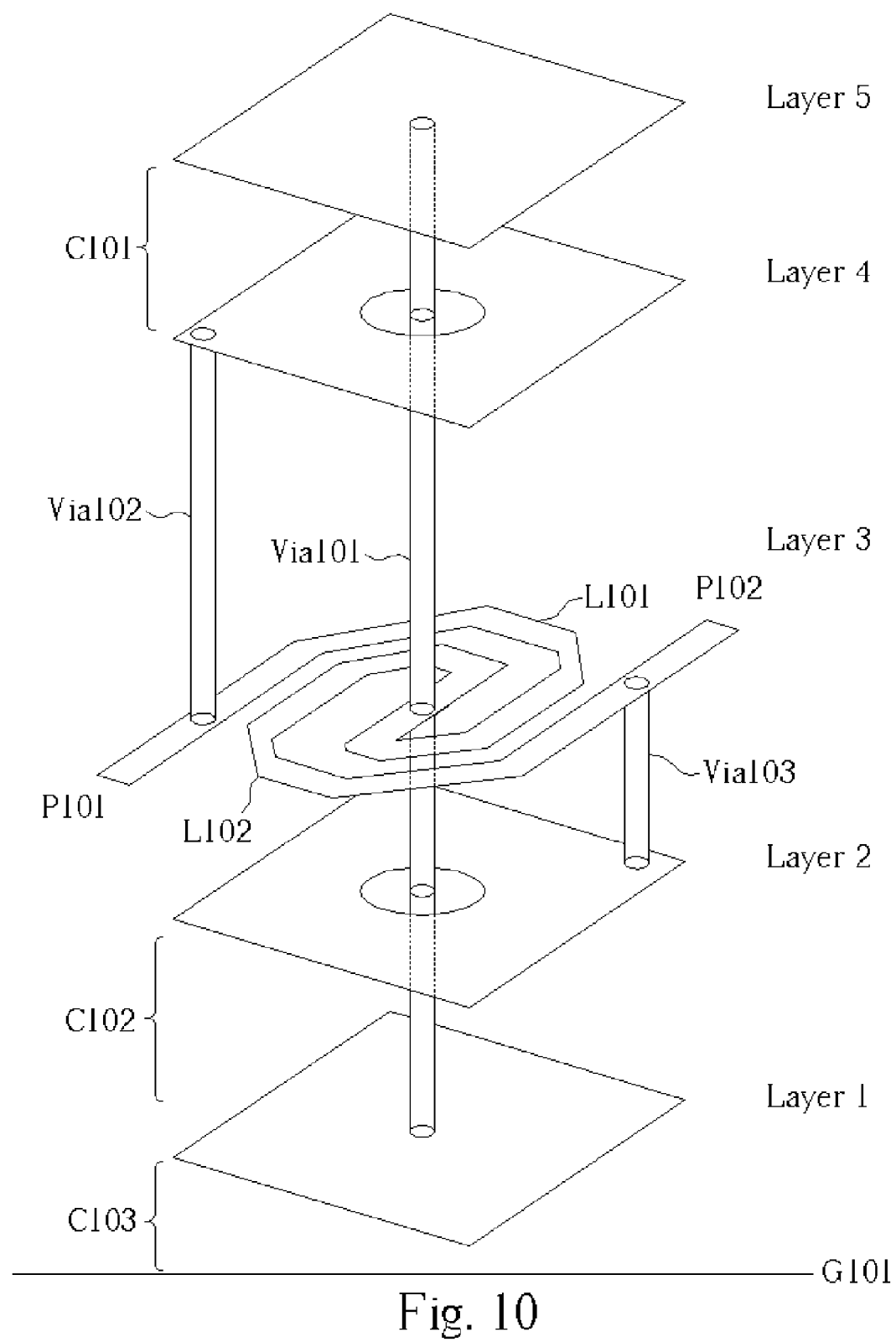
FIG. 10 is a diagram of a fourth embodiment of the present invention lumped-element low-pass filter realized in a multi-layered substrate.

Please refer to FIG. 10. FIG. 10 is the fourth embodiment of the present invention low-pass filter. The embodiment shown in FIG. 10 is realized in a multi-layered substrate with a bottom ground plane G101. FIG. 10 shows inductors L101 and L102, capacitors C101, C102, and C103, and vias Via101, Via102, and Via103 penetrating the substrate and connecting different layers. The inductors L101 and L102 are realized by octagonal conductive spirals together on layer 3. The inductor L102 is electrically connected to the inductor L101 in series at their joint with Via101. Note that the orientations of the inductors L101 and L102 are different such that a negative mutual inductance LM10 is established between the inductors L101 and L102 with this arrangement. The capacitor C101 comprises two plates formed on layer 4 and layer 5. The plate formed on layer 4 is connected to one end of the inductor L101 through the via Via102 and the plate formed on layer 5 is connected to the via Via101. In this manner, the capacitor C101 is shunt-connected to the inductor L101 through the vias. The capacitor C102 comprises two plates formed on a layer 1 and layer 2. The plate formed on layer 2 is connected to one end of the inductor L102 through the via Via103 and the plate formed on layer 1 is connected to another end of the inductor L102 through the via Via101. Consequently, the capacitor C102 is shunt-connected to the inductor L102 through the vias. The capacitor C103 is formed between the plate on layer 1 and the bottom ground plane G101. The resulting circuit of FIG. 10 is equivalent to the circuit shown in FIG. 4 in which the inductances L101, L102, LM10, and the capacitances C101, C102, and C103 correspond to the inductances L41, L42, LM4, and the capacitances C41, C42, and C43 respectively, and may achieve the frequency response as shown in FIG. 5. For inductors L101 and L102 being on the same substrate layer, the mutual inductance LM10 is adjusted by appropriately selecting the strip width and gap width of the spirals. Compared to the other embodiments, the low-pass filter in FIG. 10 has the advantage that it can be realized with one less substrate layer.

The present invention low-pass filter utilizes a negative mutual inductance between inductors for improving the rejection in the stopband. The lumped-element low-pass filter of the present invention is preferably formed in a multi-layered ceramic substrate, such as a low temperature co-fired ceramic (LTCC) substrate, for smaller size. For the circuits in all embodiments enumerated above, the spiral inductors can be rectangular, circular, or octagonal in shape. The inductors can also occupy more than one layer for larger inductance values or for controlling the mutual inductance between them. Similarly, the capacitors can also be implemented on more substrate layers to achieve higher capacitance values in a smaller area. Good rejection in the stopband of the present invention low-pass filter has been proven by experiment, and better roll-off rate at passband edge than that of a conventional elliptic-type low-pass filter of the same order is observed. Compared to the prior art, with the utilization of the negative mutual inductance, the rejection in the stopband of the present invention lumped-element low-pass filter is improved without adding additional elements or increasing the order of the filter.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A lumped-element low-pass filter formed in a multi-layered substrate comprising:
    a first inductor;
    a second inductor electrically connected to the first inductor in series at one end, wherein the first and second inductors are spiral in shape and the orientations of the first inductor and the second inductor are of opposite sense such that a mutual inductance between the first inductor and the second inductor is negative and equals a first value;
    a first capacitor shunt-connected to the first inductor;
    a second capacitor shunt-connected to the second inductor; and
    a third capacitor having a first end electrically connected to ground and a second end electrically connected to the end of the second inductor at which the second inductor in connected to the first inductor;
    wherein the first inductor is formed on a fourth layer of the multi-layered substrate, the second inductor is formed on a third layer of the multi-layered substrate and is electrically connected to the first inductor in series through a first via penetrating the substrate, the first capacitor comprises two plates formed on a fifth layer and a sixth layer of the multi-layered substrate, in which the plate formed on the fifth layer is connected to the first inductor through a second via penetrating the substrate and the plate formed on the sixth layer is connected to the first via, the second capacitor comprises two plates formed on a first layer and a second layer of the multi-layered substrate, in which the plate formed on the second layer is connected to the second inductor through a third via penetrating the substrate and the plate formed on the first layer is connected to the first via, and the third capacitor is formed between the first layer and a ground layer of the multi-layered substrate, in which the first layer is next to the ground layer.

2. The lumped-element low-pass filter of claim 1 wherein the sixth layer is next to a second ground layer so that a fourth capacitor is formed between the sixth layer and the second ground layer and is shunt-connected with the third capacitor.

3. The lumped-element low-pass filter of claim 1 wherein the first and second capacitors sandwich the first and second inductors.

4. The lumped-element low-pass filter of claim 1 wherein the third capacitor is two shunt-connected capacitors, each of which is formed on at least one layer of the multi-layered substrate.

5. The lumped-element low-pass filter of claim 1 wherein the multi-layered substrate is a low temperature co-fired ceramic (LTCC) substrate.

6. The lumped-element low-pass filter of claim 1 wherein spirals of the first and second inductors are rectangular, circular, or octagonal in shape.

7. The lumped-element low-pass filter of claim 1 wherein the first value is according to a predetermined characteristic of frequency response and values of the first inductor, the second inductor, the first capacitor, the second capacitor, and the third capacitor.

8. The lumped-element low-pass filter of claim 1 wherein the first value is according to shapes of and a relative distance between the first inductor and the second inductor so that the mutual inductance equals the first value.

9. The lumped-element low-pass filter of claim 1 wherein at least one inductor is formed on a plurality of layers of the multi-layered substrate.

10. The lumped-element low-pass filter of claim 1 wherein at least one capacitor comprises a plurality of plates formed on a plurality of layers of the multi-layered substrate.

11. A lumped-element low-pass filter formed in a multi-layered substrate comprising:
    a first inductor;
    a second inductor electrically connected to the first inductor in series at one end, wherein the first and second inductors are spiral in shape and the orientations of the first inductor and the second inductor are of opposite sense such that a mutual inductance between the first inductor and the second inductor is negative and equals a first value;
    a first capacitor shunt-connected to the first inductor;
    a second capacitor shunt-connected to the second inductor; and
    a third capacitor having a first end electrically connected to ground and a second end electrically connected to the end of the second inductor at which the second inductor in connected to the first inductor;
    wherein the first inductor is formed on a fourth layer of the multi-layered substrate, the second inductor is formed on a third layer of the multi-layered substrate and is electrically connected to the first inductor in series through a first via penetrating the substrate, the first capacitor comprises two plates formed on a fifth layer and a sixth layer of the multi-layered substrate, in which the plate formed on the sixth layer is connected to the first inductor through a second via penetrating the substrate and the plate formed on the fifth layer is connected to the first via, the second capacitor comprises two plates formed on a first layer and a second layer of the multi-layered substrate, in which the plate formed on the second layer is connected to the second inductor through a third via penetrating the substrate and the plate formed on the first layer is connected to the first via, and the third capacitor is formed between the first layer and a ground layer of the multi-layered substrate, in which the first layer is next to the ground layer.

12. The lumped-element low-pass filter of claim 11 wherein the first and second capacitors sandwich the first and second inductors.

13. A lumped-element low-pass filter formed in a multi-layered substrate comprising:
    a first inductor;
    a second inductor electrically connected to the first inductor in series at one end, wherein the first and second inductors are spiral in shape and the orientations of the first inductor and the second inductor are of opposite sense such that a mutual inductance between the first inductor and the second inductor is negative and equals a first value;
    a first capacitor shunt-connected to the first inductor;
    a second capacitor shunt-connected to the second inductor; and
    a third capacitor having a first end electrically connected to ground and a second end electrically connected to the end of the second inductor at which the second inductor in connected to the first inductor;
    wherein the first inductor is formed on a third layer of the multi-layered substrate, the second inductor is also formed on the third layer and is electrically connected to the first inductor in series at an end, the first capacitor comprises two plates formed on a fourth layer and a fifth layer of the multi-layered substrate, in which the plate formed on the fifth layer is connected to the end of the second inductor at which the second inductor is connected to the first inductor through a first via penetrating the substrate and the plate formed on the fourth layer is connected to the first inductor through a second via penetrating the substrate, the second capacitor comprises two plates formed on a first layer and a second layer of the multi-layered substrate, in which the plate formed on the second layer is connected to the second inductor through a third via penetrating the substrate and the plate formed on the first layer is connected to the first via, and the third capacitor is formed between the first layer and a ground layer of the multi-layered substrate, in which the first layer is next to the ground layer.

14. The lumped-element low-pass filter of claim 13 wherein the first and second capacitors sandwich the first and second inductors.

* * * * *